United States Patent
Chen et al.

(10) Patent No.: US 7,328,383 B2
(45) Date of Patent: *Feb. 5, 2008

(54) CIRCUIT AND METHOD FOR TESTING EMBEDDED PHASE-LOCKED LOOP CIRCUIT

(75) Inventors: Murphy Chen, Shindian (TW);
Perlman Hu, Shindian (TW)

(73) Assignee: Via Technologies, Inc. (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/528,017

(22) Filed: Sep. 27, 2006

(65) Prior Publication Data

US 2007/0168791 A1    Jul. 19, 2007

Related U.S. Application Data

(63) Continuation of application No. 10/352,439, filed on Jan. 28, 2003, now Pat. No. 7,168,020.

(30) Foreign Application Priority Data

Mar. 5, 2002    (TW) ................................ 91104077 A

(51) Int. Cl.
*G01R 31/28* (2006.01)
(52) U.S. Cl. ........................ 714/724; 714/719; 365/201
(58) Field of Classification Search ..................... None
See application file for complete search history.

(56) References Cited

U.S. PATENT DOCUMENTS

| 5,781,038 A |   | 7/1998  | Ramamurthy et al. |        |
|-------------|---|---------|-------------------|--------|
| 5,889,435 A |   | 3/1999  | Smith et al.      |        |
| 6,557,117 B1| * | 4/2003  | Wu et al.         | 714/30 |
| 6,807,498 B2| * | 10/2004 | Premy             | 702/79 |

* cited by examiner

*Primary Examiner*—Guy Lamarre
*Assistant Examiner*—Steve D Radosevich
(74) *Attorney, Agent, or Firm*—Volpe and Koenig, PC

(57) ABSTRACT

In a method for testing an embedded phase-locked loop (PLL) circuit, a first clock signal is provided to an embedded phase-locked loop (PLL) circuit to be tested. A PLL clock signal of a first frequency is generated by the embedded PLL in response to the first clock signal. The PLL clock signal of the first frequency is sampled with a second clock signal of a second frequency to generate a first sampled signal, wherein the second frequency is different from the first frequency but has a first correlation with the first frequency so that the first sampled signal toggles at a predetermined frequency when the embedded PLL circuit is in a normal operation condition. The embedded PLL circuit is determined to be in an abnormal operation condition if the first sampled signal does not toggle at said predetermined frequency.

9 Claims, 4 Drawing Sheets

CIRCUIT AND METHOD FOR TESTING EMBEDDED PHASE-LOCKED LOOP CIRCUIT

CROSS REFERENCE TO RELATED PATENT APPLICATION

The patent application is a continuation application (CA) of a U.S. patent application Ser. No. 10/352,439 filed Jan. 28, 2003, and now U.S. Pat. No. 7,168,020. The content of the related patent application is incorporated herein for reference.

FIELD OF THE INVENTION

The present invention relates to a circuit for testing an embedded phase-locked loop (PLL) circuit, and more particularly to a testing circuit for diagnosing the clock of an embedded phase-locked loop (PLL) circuit. The present invention also relates to a method for testing an embedded phase-locked (PLL) circuit to diagnose the PLL clock.

BACKGROUND OF THE INVENTION

Conventionally, test vectors are prevalently employed to screen out the unqualified chips. Since the parameters, such as the frequency, phase and duty cycle, of the clock inputted from a tester into the chip are precisely controlled, a specific test vector inputted into a normal chip is supposed to be outputted as expected. In other words, when the output of the chip in response to the specific test vector shows an unexpected result, the chip is determined to be an unqualified chip and should be ruled out.

Presently, a phase-locked loop (PLL) circuit is usually embedded in the chip for providing the clock signals of all required frequencies for the chip, thereby reducing the cost. Since the clock signal generated by the embedded PLL circuit is not a pure digital signal and its phase delay is unpredictable, there have been no specific test vectors, so far, and corresponding outputs for the embedded PLL circuit to perform test. Therefore, the embedded PLL circuit is not particularly tested in the prior art.

Therefore, the purpose of the present invention is to develop a circuit and a method for testing an embedded phase-locked loop (PLL) circuit to deal with the above situations encountered in the prior art.

SUMMARY OF THE INVENTION

The present invention is capable of testing an embedded phase-locked (PLL) circuit to properly diagnose the embedded PLL circuit for reducing errors.

In an embodiment, a method for testing an embedded phase-locked loop (PLL) circuit includes steps of: providing a first clock signal to an embedded phase-locked loop (PLL) circuit to be tested; generating a PLL clock signal of a first frequency by the embedded PLL in response to the first clock signal; sampling the PLL clock signal of the first frequency with a second clock signal of a second frequency to generate a first sampled signal, wherein the second frequency is different from the first frequency but has a first correlation with the first frequency so that the first sampled signal toggles at a predetermined frequency when the embedded PLL circuit is in a normal operation condition; and determining the embedded PLL circuit is in an abnormal operation condition if the first sampled signal does not toggle at the predetermined frequency.

In an embodiment, a method for testing an embedded phase-locked loop (PLL) circuit includes steps of: providing a first clock signal to an embedded phase-locked loop (PLL) circuit to be tested; generating a PLL clock signal of a first frequency by the embedded PLL in response to the first clock signal; sampling the PLL clock signal of the first frequency with a second clock signal of a second frequency to generate a first sampled signal, wherein the second frequency is different from the first frequency but has a first correlation with the first frequency; sampling the first sampled signal with the second clock signal of the second frequency to generate a second sampled signal; logically operating the first sampled signal and the second sampled signal to obtain a logic operational result; and directly referring to the logic operational result to determine whether the embedded PLL circuit is in a normal operation condition.

In an embodiment, a method for testing an embedded phase-locked loop (PLL) circuit includes steps of: providing a first clock signal to an embedded phase-locked loop (PLL) circuit to be tested; generating a PLL clock signal of a first frequency by the embedded PLL in response to the first clock signal; sampling the PLL clock signal of the first frequency with a second clock signal of a second frequency to generate a first sampled signal, wherein the second frequency is different from the first frequency but has a first correlation with the first frequency; sampling the first sampled signal with the second clock signal of the second frequency to generate a second sampled signal; inverting the second clock signal of the second frequency to obtain an inverted second clock signal; sampling the PLL clock signal of the first frequency with the inverted second clock signal to generate a third sampled signal; sampling the third sampled signal with the inverted second clock signal to generate a fourth sampled signal; logically operating the first sampled signal and the second sampled signal to obtain a first logic operational output; logically operating the third sampled signal and the fourth sampled signal to obtain a second logic operational output; and logically operating the first logic operational output and the second logic operational output to obtain an indication signal; and directly referring to the indication signal to determine whether the embedded PLL circuit is in a normal operation condition.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The present invention provides a method for testing an embedded phase-locked loop (PLL) circuit. First of all, a clock signal of a relatively low frequency is inputted to an embedded PLL circuit to be tested. After the embedded PLL circuit reaches a stable condition, the embedded PLL stably outputs a PLL clock signal in response to the clock signal of the low frequency. Subsequently, the PLL clock signal is sampled with a clock signal of a relatively high frequency to generate a sampled signal. According to the sampled signal, it is determined whether the embedded PLL circuit operates normally. If the embedded PLL circuit is in the normal operation, the clock signal outputted thereby toggles at a predetermined frequency with substantially 50% duty cycle. Hence, if the high frequency is 2 or 2/(2n+1) times the low frequency, where n is zero or positive integer, then one of two adjacent states of the sampled signal should be of a high level, i.e. logic 1, and the other is of a low level, i.e. logic 0. Accordingly, by comparing the logic levels of two successive states of the sampled signal, the toggling situation of the embedded PLL can be determined. On the other hand, if the duty cycle of the clock signal outputted from the embedded PLL circuit is much larger or smaller than 50%, for example larger than 75% or smaller than 25%, then the embedded PLL circuit is still considered "abnormal" even though the frequency of the outputted clock signal is correct. In the case that the duty cycle is far away from 50%, the two successive sampled signals are likely to be of the same logic level, i.e. both logic 1 or both logic 0. Accordingly, the duty cycle can be determined on the basis of two successive sampled states of the clock signal. Therefore, it is easy to determine whether the embedded PLL circuit is in the normal operation condition by comparing the logic levels of two successive sampled signal states.

Figure 1:
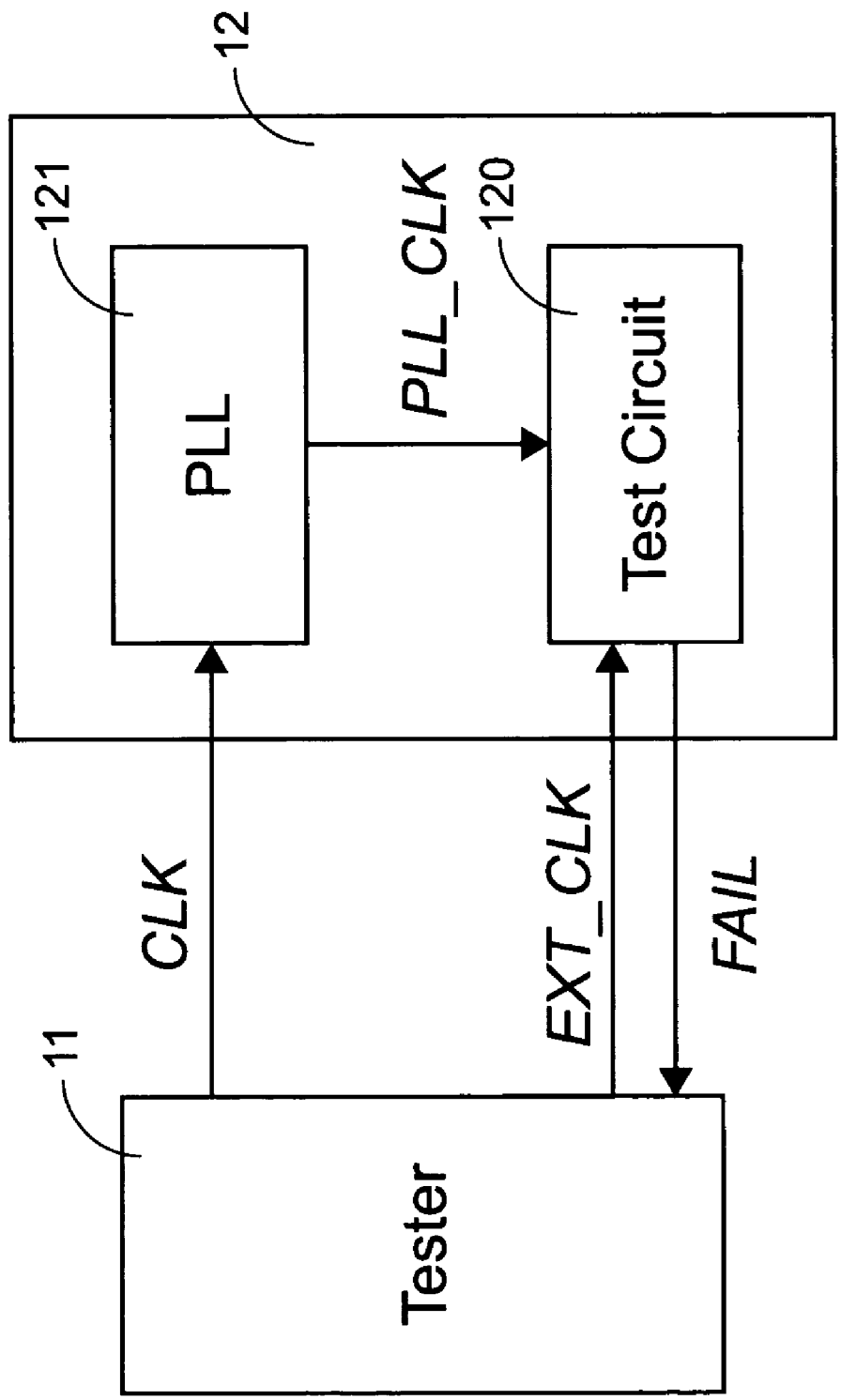
FIG. 1 is a schematic circuit block diagram illustrating a testing circuitry according to the present invention for diagnosing the PLL circuit embedded in a chip.

Please refer to FIG. 1 which is a schematic circuit block diagram including a test circuitry according to the invention. A test circuit 120 is integrated into the integrated circuit (IC) chip 12 and electrically connected to the embedded PLL circuit 121 to be tested. An external clock signal (CLK) from a tester 11 is transmitted to the PLL circuit 121, thereby generating the PLL clock signal (PLL_CLK). The tester 11 further provides another external clock signal (EXT_CLK) for the test circuit 120 for the test of the PLL clock signal (PLL_CLK). In this embodiment, both the PLL circuit 121 and the test circuit 120 are embedded in the chip 12. Alternatively, the test circuit 120 can be disposed outside the chip 12.

When performing a test on the chip 12, the tester 11 outputs a clock signal CLK into the embedded PLL circuit 121, and another clock signal EXT_CLK to the test circuit 120. After a predetermined time period, for example 2.05 ms, the embedded PLL circuit 121 oscillates stably. If the embedded PLL 121 operates normally, a stable clock signal PLL_CLK will be outputted in response to the clock signal CLK. For the purpose of test, the clock signal PLL_CLK is transmitted to the test circuit 120. The duty cycle of the clock signal EXT_CLK is 50% and the frequency thereof is, for example, twice that of the clock signal PLL_CLK. After receiving the clock signal PLL_CLK from the embedded PLL 121 and the clock signal EXT_CLK from the tester 11, the test circuit 120 outputs an indication signal FAIL to the tester 11. If the indication signal FAIL is at a high level, i.e. logic "1", the embedded PLL circuit 121 is determined to operate abnormally by the tester 11. On the contrary, if the indication signal FAIL is at a low level, i.e. logic "0", the embedded PLL circuit 121 is determined to be in normal operation. In practice, the frequency of the clock signal EXT_CLK can be 2/(2n+1) times that of the clock signal PLL_CLK where n is zero or positive integer.

Figure 2:
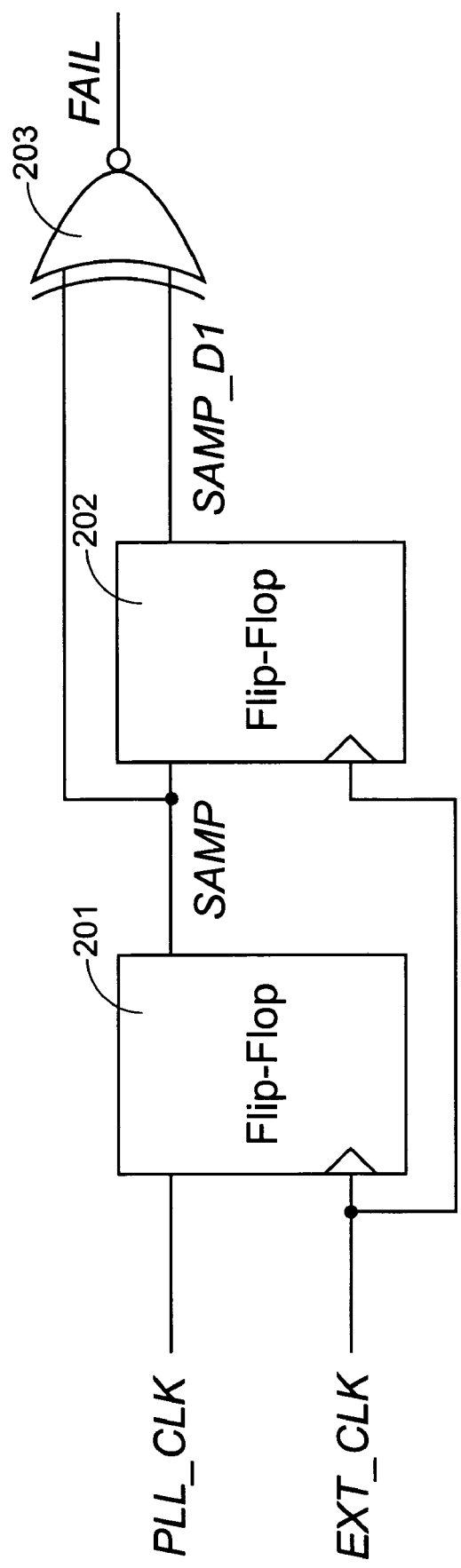
FIG. 2 is a circuit block diagram illustrating a preferred embodiment of the test circuit of FIG. 1.

Please refer to FIG. 2 which is a circuit block diagram exemplifying the test circuit 120 in FIG. 1. The test circuit includes two flip-flops 201 and 202 and an XNOR gate 203. An input end of the flip-flop 201 is connected to the output end of the embedded PLL circuit (not shown) for receiving therefrom the clock signal PLL_CLK. Another input end of the flip-flop 201 is connected to the output end of the tester 11 (not shown) for receiving therefrom the clock signal EXT_CLK, and so is an input end of the flip-flop 202. The output end of the flip-flop 201 is connected to an input end of the flip-flop 202. The output ends of the flip-flops 201 and 202 are connected to the two input ends of the XNOR gate 203, respectively, and the output end of the XNOR gate 203 is connected to the testing end of the tester 11.

Figure 3:
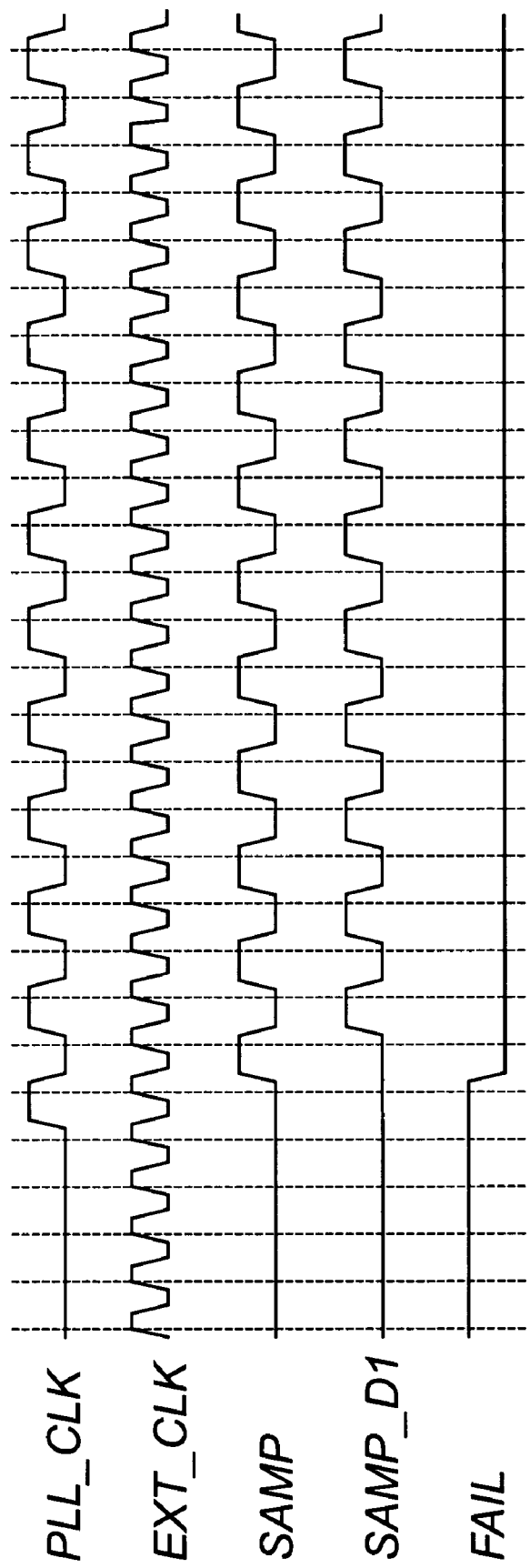
FIG. 3 is a schematic waveform diagram illustrating concerned signals in the IC chip according to the present invention.

Further refer to FIG. 3 showing a schematic waveform diagram illustrating concerned signals according to the present invention. Assume that the embedded PLL circuit 121 generates the clock signal PLL_CLK with a predetermined frequency stably. Since the frequency of the clock signal EXT_CLK is twice that of the clock signal PLL_CLK, the flip-flop 201 is triggered twice every cycle of the clock signal PLL_CLK. Thus, the sampled signal SAMP outputted from the flip-flop 201 toggles, and has a period twice that of the clock signal EXT_CLK from the tester 11. That is, the SAMP toggles with the same frequency as the clock signal PLL_CLK. Similarly, since the frequency of the clock signal EXT_CLK is twice that of the sampled signal SAMP outputted by the flip-flop 201, the flip-flop 202 is triggered twice every cycle of the sampled signal SAMP. Hence, the sampled signal SAMP_D1 outputted from the flip-flop 202 toggles, and has a frequency twice that of the EXT_CLK from the tester 11.

In addition, since both the sampled signals SAMP from the flip-flop 201 and SAMP_D1 from the flip-flop 202 are triggered in response to the clock signal EXT_CLK from the tester 11, they have the same frequency. Since the starting operation of the flip-flop 202 lags behind the flip-flop 201 by one cycle of the clock signal EXT_CLK. the sampled signal SAMP_D1 is delayed by one cycle of the clock signal EXT_CLK. Thus, the waveforms of the sampled signals SAMP and SAMP_D1 are in inverse phase as shown in FIG. 3.

The sampled signals SAMP and SAMP_D1 are transmitted to the XNOR gate 203, as shown in FIG. 2, and the XNOR gate 203 performs an XNOR operation on them and then outputs an indication signal FAIL. Due to the inverse phase of the two sampled signals, the indication signal FAIL is logic "0". The low level of the indication signal FAIL indicates the embedded PLL circuit 121 operates normally. On the other hand, if the embedded PLL circuit 121 abnormally operates, the output signal FAIL will be logic "1".

For example, if the output signal of the embedded PLL circuit is kept at logic "0", i.e. not toggling at all, the sampled signals SAMP and SAMP_D1 are both be logic "0". Through the operation of the XNOR 203, the output of logic "1" is obtained, and the high level of the indication signal FAIL indicates the abnormal operation, i.e. untoggling in this case. Therefore, the invention can precisely determine whether the embedded PLL circuit operates normally or not according to the logic state of the output signal from the XNOR gate 203.

In another example, when the frequency of the clock signal PLL_CLK is not as stable as expected, the embedded PLL circuit 121 is determined abnormal according to the following criterion. If the frequency of the clock signal PLL_CLK is not stable, the same logic status may happen for the sampled signals SAMP and SAMP_D1, i.e. both logic "1" or logic "0" at the same sampling point. Under this circumstance, the indication signal FAIL from the XNOR gate 203 becomes logic "1", and the abnormal condition of the PLL circuit 121 is indicated. For example, after one million cycles of the clock signal EXT_CLK, the logic "1" status of the indication signal FAIL may happen. Of course, it can be determined that the embedded PLL circuit 121 normally operates if the indication signal from the XNOR gate 203 always keeps at logic "0" for a predetermined time period.

Moreover, when the duty cycle of the clock signal PLL_CLK is much larger or much smaller than 50%, e.g. larger than 75% or smaller than 25%, the sampled signals SAMP and SAMP_D1 are possibly at logic "1" or logic "0" simultaneously because the adjacent half-cycles of the jittering signal PLL_CLK are sampled with the ideal double frequency signal EXT_CLK. Under this circumstance, the indication signal FAIL outputted from XNOR gate 203 is logic "1", and the abnormal condition of the PLL circuit 121 is indicated. In other words, when the duty cycle of the clock signal PLL_CLK is far away from 50%, the embedded PLL circuit 121 is considered abnormal even though the frequency of the PLL_CLK is as stable as expected. Of course, it can be determined that the embedded PLL 121 normally operates in response to the continuous low-level state of the indication signal FAIL from the XNOR gate 203.

Figure 4:
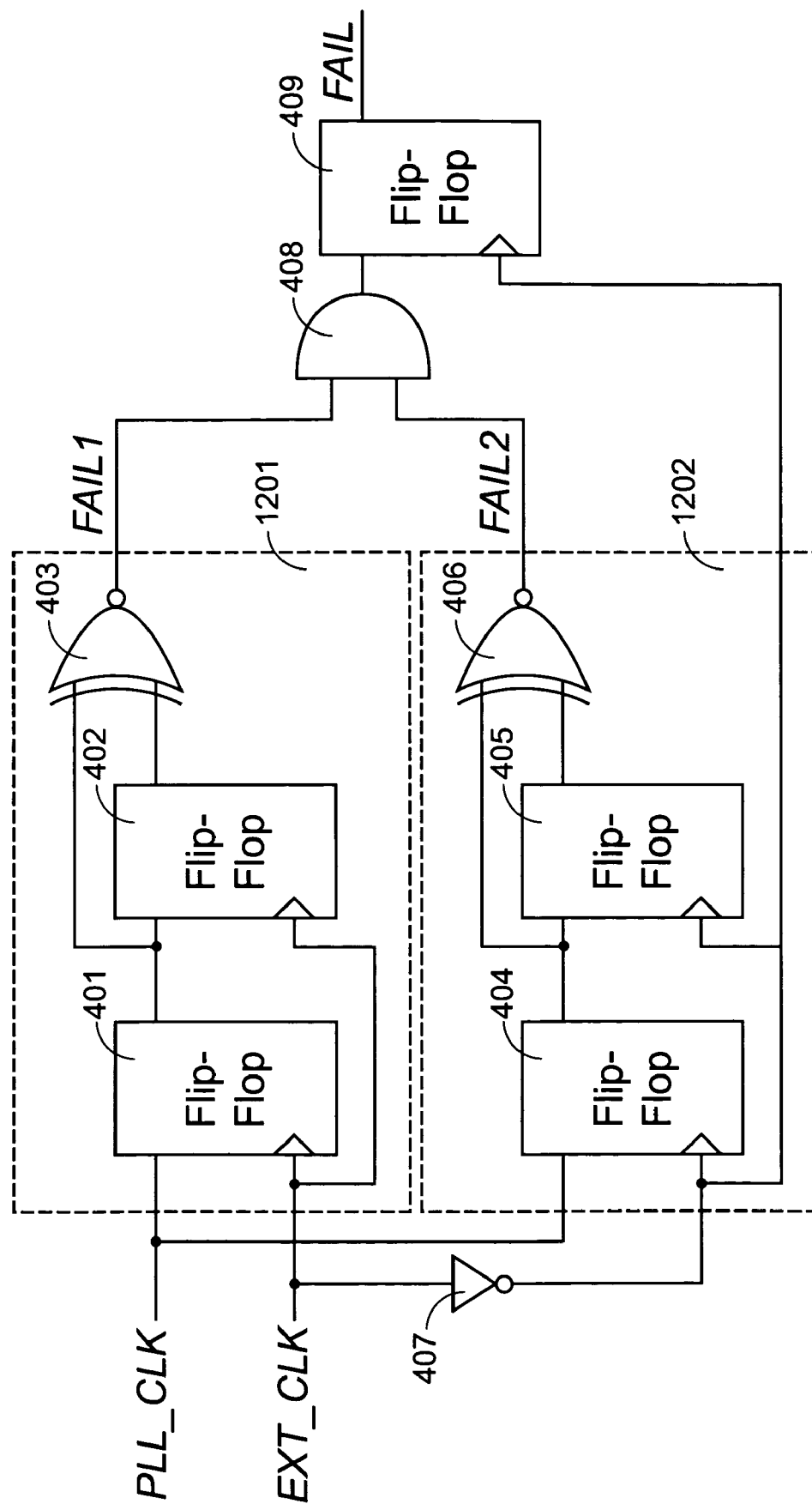
FIG. 4 is a circuit block diagram illustrating another preferred embodiment of the test circuit of FIG. 1.

Please refer to FIG. 4 which is a circuit block diagram illustrating another preferred embodiment of the test circuit 121 of FIG. 1. The test circuit includes two sub-circuits 1201 and 1202, a inverter 407, an AND gate 408 and an output flip-flop 409. The sub-circuit 1201 includes two flip-flops 401 and 402 and an XNOR gate 403, and the sub-circuit 1202 includes two flip-flops 404 and 405 and an XNOR gate 406. The duplication of the sub-circuits 1201 and 1202 double checks the testing procedure, and assures of the accuracy of the test system.

Two respective input ends of the flip-flops 401 and 404 are both connected to the output end of the embedded PLL (not shown in FIG. 4) for receiving therefrom the clock signal PLL_CLK. The other input ends of the flip-flops 401 and 404 are both connected to the output end of the tester (not shown in FIG. 4) for receiving therefrom the clock signal EXT_CLK. The output ends of the flip-flops 401 and 404 are connected to two input ends of the flip-flops 402 and 405, respectively. The other input ends of the flip-flops 404 and 405 are connected to the output end of the inverter 407. The input end of the inverter 407 is connected to the tester (not shown in FIG. 4) for receiving therefrom the clock signal EXT_CLK. The output ends of the flip-flops 401 and 402 are connected to the two input ends of the XNOR gate 403, respectively. The output ends of the flip-flops 404 and 405 are connected to the two input ends of the XNOR gate 406, respectively. The output ends of the XNOR gates 403 and 406 are connected to the two input ends of the AND gate 408, respectively. The output end of the AND gate 408 is connected to the input end of the output flip-flop 409 which has another input end connected to the output end of the inverter 407, as shown in FIG. 4. The output end of the inverter 407 is further connected to the tester 11 for outputting therefrom the indication signal FAIL.

The structure and function of each of the sub-circuits 1201 and 1202 are similar to those of the test circuit 120 of FIG. 1. Since the phase of the clock signal EXT_CLK is shifted by 180 degrees by the inverter 407, the time points for sampling the clock signals PLL_CLK are different for the test circuits 1201 and 1202, and the time difference therebetween is a half cycle of the clock signal EXT_CLK. The inverter 407 functions for staggering the sampling time points of the sub-circuits 1201 and 1202, for example, by a half cycle of the clock signal EXT_CLK. By this way, while one of the sub-circuits 1201 and 1202 samples at a transition state of the clock signal PLL_CLK, which possibly causes an error, the other samples within the stable range of the clock signal PLL_CLK, which will obtain a correct result.

When the embedded PLL circuit is under the normal operation condition to generate a stable and predetermined frequency, both outputs FAIL1 and FAIL2 of the sub-circuits 1201 and 1202 are logic "0". Since both the input ends of the AND gate 408 are logic "0", the input end of the output flip-flop 409 connected, to the AND gate 408 is logic "0". Accordingly, the flip-flop 409 outputs logic "0" to the test end of the tester 11 in response to the reverse clock signal EXT_CLK.

Even when one of the sub-circuits 1201 and 1202 samples at a time point around the transition state, which possibly causes an error, the other samples at the stable range of the clock signal PLL_CLK, which will obtain a correct result. In other words, no matter what logic state is rendered for the sub-circuit 1201 or 1202, either "0" or "1", the other sub-circuit always outputs logic "0". Under this circumstance, through the AND gate 408, a logic "0" status will be guaranteed at the input end of the output flip-flop 409, resulting in the output of a logic "0" from the output flip-flop 409 to the test end of the tester 11 in response to the clock signal EXT_CLK.

On the contrary, when both the sub-circuits 1201 and 1202 output logic "1" to the two input ends of the AND gate 408, the embedded PLL circuit is determined to be under an abnormal operation condition. Since both input ends of the AND gate 408 are at logic "1", a logic "1" status is rendered at the input end of the output flip-flop 409, resulting in that the output flip-flop 409 outputs logic "1" to the test end of the tester 11 in response to the reverse clock signal EXT-CLK. In practice, the abnormal operation condition may include signal drift, signal delay and/or signal jitter.

According to this embodiment using two sub-circuits 1201 and 1202 and the AND gate 408 to prevent over-killed, an output of logic "1" from the AND gate 408 to the tester 11 will be rendered only when both input ends of the AND gate 408 are logic "1". Moreover, in a case that glitches occasionally occur at the circuit output end, the erroneous indication can be prevented by sampling the output flip-flop 409 only at the triggered moment. It should be understood that the probability of simultaneous occurrence of the glitch and the sampling operation is extremely low, so the output flip-flop 409 may be used for eliminating the glitch to reduce the erroneous indication of the tester 11.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for testing an embedded phase-locked loop (PLL) circuit comprising steps of:
   Providing a first clock signal to an embedded phase-locked loop (PLL) circuit to be tested;
   Generating a PLL clock signal of a first frequency by said embedded PLL in response to said first clock signal;
   Sampling said PLL clock signal of said first frequency with a second clock signal of a second frequency to generate a first sampled signal, wherein said second frequency is different from said first frequency but has a first correlation with said first frequency so that said first sampled signal toggles at a predetermined frequency when said embedded PLL circuit is in a normal operation condition;
   Sampling said first sampled signal to generate a second sampled signal with said second clock signal of said second frequency;
   Logically operating said second sample signal with said first sampled signal to generate an indication signal; and
   Determining said embedded PLL circuit is in an abnormal operation condition when said indication signal is at a first logic level while determining said embedded PLL circuit is in a normal operation condition when said indication signal is at a second level.

2. The method according to claim 1 wherein said second frequency is 2/(2n+1) times said first frequency, where n is zero or positive integer.

3. The method according to claim 1 wherein said first logic level is a logic high level and said second logic level is a logic low level.

4. A method for testing an embedded phase-locked loop (PLL) circuit comprising steps of:
   providing a first clock signal to an embedded phase-locked loop (PLL) circuit to be tested;
   generating a PLL clock signal of a first frequency by said embedded PLL in response to said first clock signal;
   sampling said PLL clock signal of said first frequency with a second clock signal of a second frequency to generate a first sampled signal, wherein said second frequency is different from said first frequency but has a first correlation with said first frequency;
   sampling said first sampled signal with said second clock signal of said second frequency to generate a second sampled signal;
   logically operating said first sampled signal and said second sampled signal to obtain a logic operational result; and
   directly referring to said logic operational result to determine whether said embedded PLL circuit is in a normal operation condition.

5. The method according to claim 4 wherein said second frequency is 2/(2n+1) times said first frequency, where n is zero or positive integer.

6. The method according to claim 4 wherein said logic operational result at logic high indicates said abnormal operation condition, and said logic operational result at logic low indicates said normal operation condition.

7. A method for testing an embedded phase-locked loop (PLL) circuit comprising steps of:
   providing a first clock signal to an embedded phase-locked loop (PLL) circuit to be tested;
   generating a PLL clock signal of a first frequency by said embedded PLL in response to said first clock signal;
   sampling said PLL clock signal of said first frequency with a second clock signal of a second frequency to generate a first sampled signal, wherein said second frequency is different from said first frequency but has a first correlation with said first frequency;
   sampling said first sampled signal with said second clock signal of said second frequency to generate a second sampled signal;
   inverting said second clock signal of said second frequency to obtain an inverted second clock signal;
   sampling said PLL clock signal of said first frequency with said inverted second clock signal to generate a third sampled signal;
   sampling said third sampled signal with said inverted second clock signal to generate a fourth sampled signal;
   logically operating said first sampled signal and said second sampled signal to obtain a first logic operational output;
   logically operating said third sampled signal and said fourth sampled signal to obtain a second logic operational output; and
   logically operating said first logic operational output and said second logic operational output to obtain an indication signal; and
   directly referring to said indication signal to determine whether said embedded PLL circuit is in a normal operation condition.

8. The method according to claim 7 wherein said second frequency is 2/(2n+1) times said first frequency, where n is zero or positive integer.

9. The method according to claim 7 wherein said indication signal is a logic high signal indicating said abnormal operation condition or a logic low signal indicating said normal operation condition.

* * * * *